US011130327B2

(12) United States Patent
    Jacquot

(10) Patent No.: US 11,130,327 B2
(45) Date of Patent: Sep. 28, 2021

(54) SYSTEM FOR LAMINATING PHOTOVOLTAIC STACKS

(71) Applicant: SOLEAN, Le Bourget-du-Lac (FR)

(72) Inventor: Claude Jacquot, Saint Eustache (FR)

(73) Assignee: Solean, Le Bourget-du-Lac (FR)

( * ) Notice: Subject to any disclaimer, the term of this patent is extended or adjusted under 35 U.S.C. 154(b) by 241 days.

(21) Appl. No.: 16/325,896

(22) PCT Filed: May 30, 2017

(86) PCT No.: PCT/EP2017/062964
§ 371 (c)(1),
(2) Date: Feb. 15, 2019

(87) PCT Pub. No.: WO2018/033261
PCT Pub. Date: Feb. 22, 2018

(65) Prior Publication Data
US 2019/0217597 A1    Jul. 18, 2019

(30) Foreign Application Priority Data

Aug. 16, 2016 (FR) ...................... 1657778

(51) Int. Cl.
    B23P 19/00    (2006.01)
    B32B 39/00    (2006.01)
    B32B 37/10    (2006.01)
    H01L 31/18    (2006.01)
    H01L 31/048   (2014.01)

(52) U.S. Cl.
    CPC .......... B32B 39/00 (2013.01); B32B 37/1018
    (2013.01); H01L 31/048 (2013.01); H01L
    31/18 (2013.01); B32B 2457/12 (2013.01);
    Y10T 29/5317 (2015.01)

(58) Field of Classification Search
    CPC ....... Y02E 10/50; H01L 31/18; H01L 31/042;
           H01L 31/0725; Y10T 29/53048; Y10T
           29/5317; Y10T 29/49002; B32B
           17/10005; Y02B 10/10
    USPC ...... 29/738, 428, 592.1, 711, 729, 742, 743,
                                             29/846, 855
    See application file for complete search history.

(56) References Cited

U.S. PATENT DOCUMENTS 9,793,421 B2 * 10/2017 Gonzalez ............ H01L 31/0516
10,043,937 B2 *  8/2018 Gonzalez ................ H01L 31/18
2005/0115667 A1   6/2005 Yokoyama

FOREIGN PATENT DOCUMENTS

EP    1923921 A2     5/2008
KR    20110047172 A  5/2011
         (Continued)

Primary Examiner — Thiem D Phan
(74) Attorney, Agent, or Firm — Thompson Coburn LLP; Steven M. Ritchey

(57) ABSTRACT

A system for laminating photovoltaic stacks comprising at least two sealed independent housings, each sealed housing delimiting an inner volume configured to contain one of the photovoltaic stacks and at least one evacuation port; a docking station, which comprises at least two independent compartments for receiving one of the sealed housings; heating means configured for heating each photovoltaic stack independently; an evacuation device for evacuating the inner volume of the sealed housings via the evacuation port; and a transfer device for transferring each sealed housing into one of the receiving compartments.

8 Claims, 12 Drawing Sheets

(56) References Cited

FOREIGN PATENT DOCUMENTS

| | | |
|---|---|---|
| KR | 20120087522 A | 8/2012 |
| WO | 2005104242 A1 | 11/2005 |
| WO | 2005106969 A1 | 11/2005 |

* cited by examiner

SYSTEM FOR LAMINATING PHOTOVOLTAIC STACKS

CROSS-REFERENCE TO RELATED APPLICATIONS

This application is a U.S. National Phase application of PCT/EP2017/057274, filed on May 30, 2017, claiming the benefit of French Application No. 1657778, filed on Aug. 16, 2016, both of which are incorporated herein by reference in their entireties.

The present invention relates to a photovoltaic stack lamination system, a photovoltaic panel manufacturing plant comprising such a lamination system, and a method for the lamination of photovoltaic stacks, wherein the method is implemented with the aid of this lamination system.

Conventionally, the manufacture of a photovoltaic panel includes a step of laminating a stack of different layers. This stack comprises a glass panel that is intended to form the upper face of the panel, a first encapsulating layer, an arrangement of photovoltaic cells and electrical conductors, a second encapsulating layer, and a rear face formed by a panel made of a polymeric, composite, or glass material. The lamination step relates to encapsulating the photovoltaic cells between the two encapsulating layers by pressure, putting the photovoltaic stack under vacuum and heating, in order to obtain crosslinking of the material constituting the encapsulating layers. At the end of this operation, the photovoltaic cells are isolated and protected by the two encapsulating layers.

To perform this operation, it is known to use a machine, generally referred to as a "laminator", which comprises two compartments separated by a membrane, one compartment of which is intended to contain the photovoltaic stack in order to heat the latter and put it under vacuum. Generally, the laminator is intended to contain several photovoltaic stacks, so that they are laminated in parallel.

However, in this type of laminator, it is not possible to separate the heating operation from the vacuum operation because the vacuum system is monopolized during the heating. In other words, it is impossible to insert or remove a photovoltaic stack during the heating step without interrupting this step. Therefore, the photovoltaic stacks must all be inserted or removed at the same time when the pressure is restored within the laminator.

Therefore, the present invention aims to overcome the disadvantages of the prior art and, in particular, the technical problems described above, by proposing a new lamination system in which photovoltaic stacks may be freely added or removed during lamination.

The object of the invention is a system for laminating photovoltaic stacks, wherein the system comprises:
at least two independent sealed housings, wherein each sealed housing delimits an internal volume that is designed to contain one of the photovoltaic stacks, wherein each sealed housing comprises at least one opening for putting the internal volume of this sealed housing under vacuum;
a receiving station, which comprises at least two independent receiving compartments, wherein each receiving compartment is designed to receive one of the sealed housings, in the internal volume of which is contained one of the photovoltaic stacks;
heating means belonging to the sealed housings and/or the receiving station, wherein the heating means are designed to independently heat each photovoltaic stack, while these photovoltaic stacks are contained in the internal volume of the sealed housings, and wherein these sealed housings are each contained in one of the receiving compartments;
a device for putting under vacuum the internal volume of the sealed housings through the vacuum opening of each of them; and
a transfer device of each sealed container containing one of the photovoltaic stacks into one of the receiving compartments, in order to heat these photovoltaic stacks using the heating means, while they are contained in the internal volume of the sealed housings under vacuum.

Thanks to the invention, the heating compartment is not itself put under vacuum, so that the insertion or removal of the photovoltaic stack may be performed even though this photovoltaic stack is under vacuum in the sealed housing. In particular, it is advantageous to introduce a first sealed housing in the docking station when this docking station already contains a second sealed housing whose internal volume is under vacuum. Therefore, the heating operation of each photovoltaic stack is independent of that of creating a vacuum. Each sealed housing is able to maintain the vacuum autonomously, i.e. separately from the docking station and the vacuum device, wherein the heating and the putting under vacuum operations of each photovoltaic stack may be either grouped in the docking station or separated, by implementing a vacuum device that is separate from this docking station.

Other advantageous features of the invention are defined below:
the transfer device comprises a first robot designed to:
  transfer the sealed housing into the receiving compartment, and
  passing the sealed housing from an open configuration, in which the photovoltaic stack may be introduced into the sealed chamber, to a closed configuration, in which the internal volume may be put under vacuum;
the sealed housing comprises a base and a cover that are designed to move between the closed configuration in which they together delimit the internal volume, and the open configuration;
the internal volume of each sealed housing comprises two chambers separated by a membrane and two vacuum openings are provided, each of which is associated with one of the chambers, wherein one of the two chambers is designed to receive the photovoltaic stack;
the vacuum device comprises internal connectors which are arranged in the receiving station, wherein each receiving compartment is provided with at least one of the internal connectors, while each internal connector is intended to be connected to the opening for putting one of the sealed housings under vacuum, when this sealed housing is contained in the receiving compartment in question, thereby proceeding to the putting of the internal volume under vacuum, via the internal connector, when the sealed housing is contained in the receiving compartment;
the vacuum device comprises means for selectively putting under vacuum the internal volume of one or more of the sealed housings connected to the internal connectors;
the device comprises means allowing communication between the internal volume of several of the sealed housings connected to the internal connectors, to allow pressure equalization of these internal volumes; and
the vacuum device comprises a vacuum station of the internal volume of the sealed housing, wherein the vacuum station is located outside the receiving station, while the sealed housing is designed to substantially maintain the low pressure of the internal volume when separated from the vacuum station.

The invention also relates to a facility for manufacturing photovoltaic panels, comprising:
- at least one machine for stacking successive layers to form photovoltaic stacks;
- a machine for interconnecting photovoltaic cells to form at least one chain of photovoltaic cells and to include this chain in each photovoltaic stack;
- a system for lamination of photovoltaic stacks, as defined above; and
- a machine for integrating junction housings with laminated photovoltaic stacks.

Other advantageous features of the invention are defined below:
- the interconnection machine comprises:
  - a distributor of photovoltaic cells and interconnection bars;
  - a reception support;
  - at least one robot for arranging the photovoltaic cells and interconnection bars on the reception support, in at least one photovoltaic cell chain; and
  - a welding device that is designed to weld the photovoltaic cells and the interconnection bars of the photovoltaic chain arranged on the reception support.

The invention also relates to a method for laminating photovoltaic stacks. According to the invention, the method is implemented using a lamination system as described above. The method comprises the following steps:
a) introduction of each photovoltaic stack in the internal volume of the sealed housings, while the sealed housings are outside of the receiving station,
b) transfer, to the receiving compartments of the receiving station, of the sealed housings whose internal volume each contains one of the photovoltaic stacks,
c) putting the internal volume of the sealed housings under vacuum, wherein each contains one of the photovoltaic stacks, via the opening for putting the sealed housing under vacuum, and
d) heating the sealed housings, independently, by means of the heating means in the receiving compartments, for heating the photovoltaic stack contained in the internal volume of the sealed housings under vacuum.

The invention will be better understood upon reading the description which follows, given solely by way of non-limiting example and with reference to the drawings, wherein.

Figure 1:
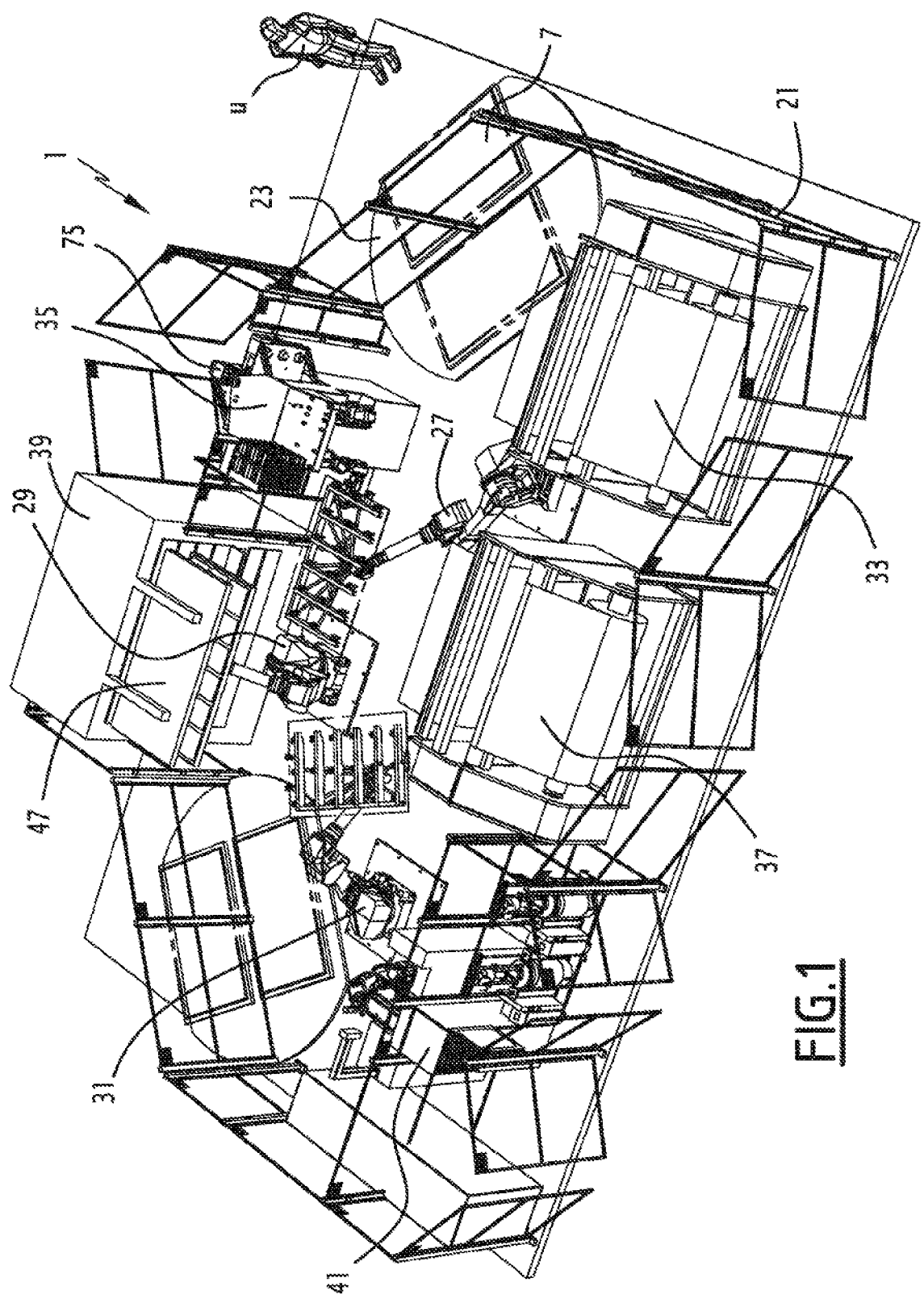
FIG. 1 shows a perspective view of an installation according to the invention.
Figure 2:
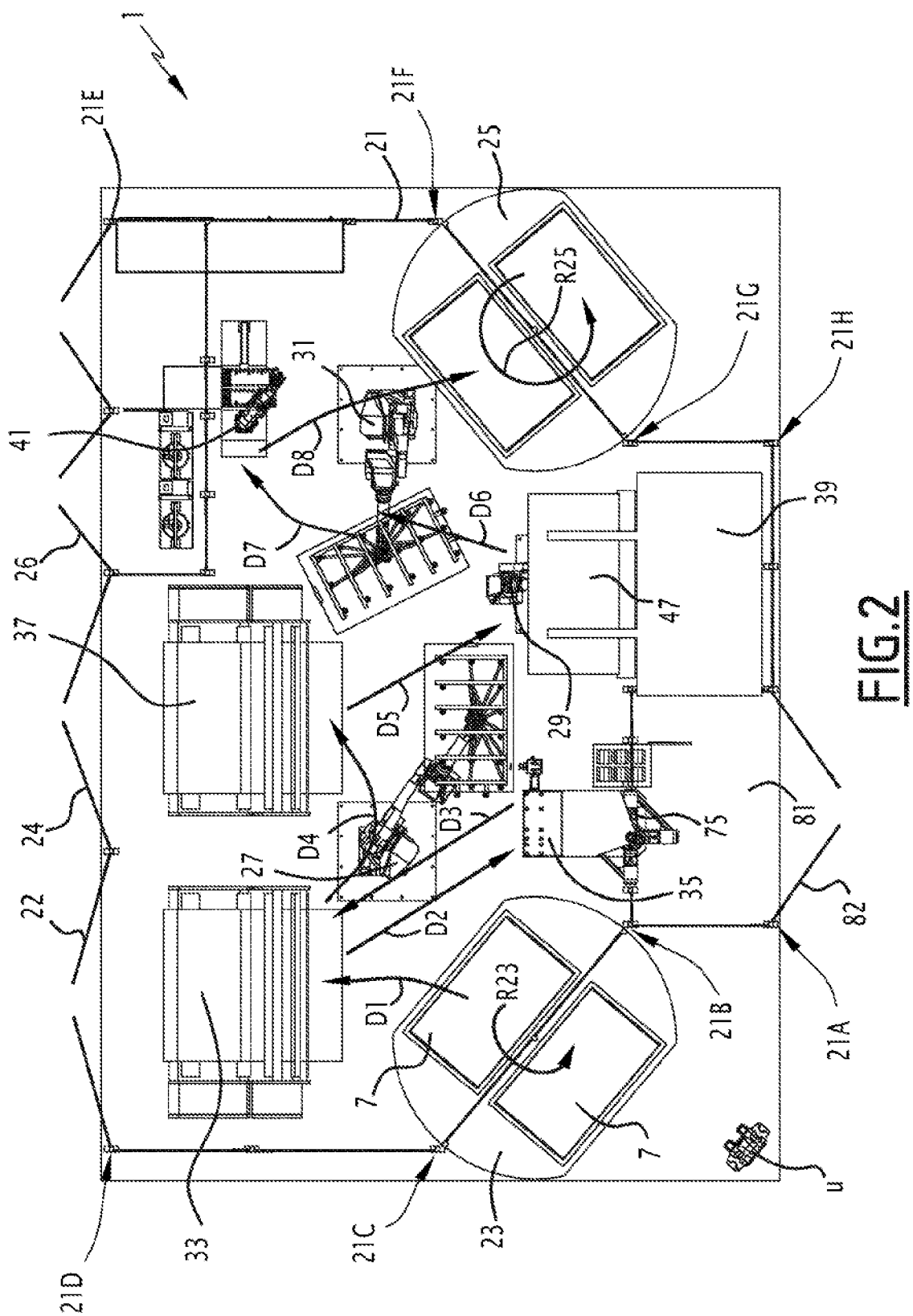
FIG. 2 shows a top view of the installation of FIG. 1.

The facility of FIGS. 1 and 2, referenced 1, makes it possible to manufacture photovoltaic panels 3 that are designed to produce electrical energy from solar energy, or more generally from a light source. For example, the photovoltaic panels manufactured by the facility are intended to equip a building or a power plant.

Figure 3:
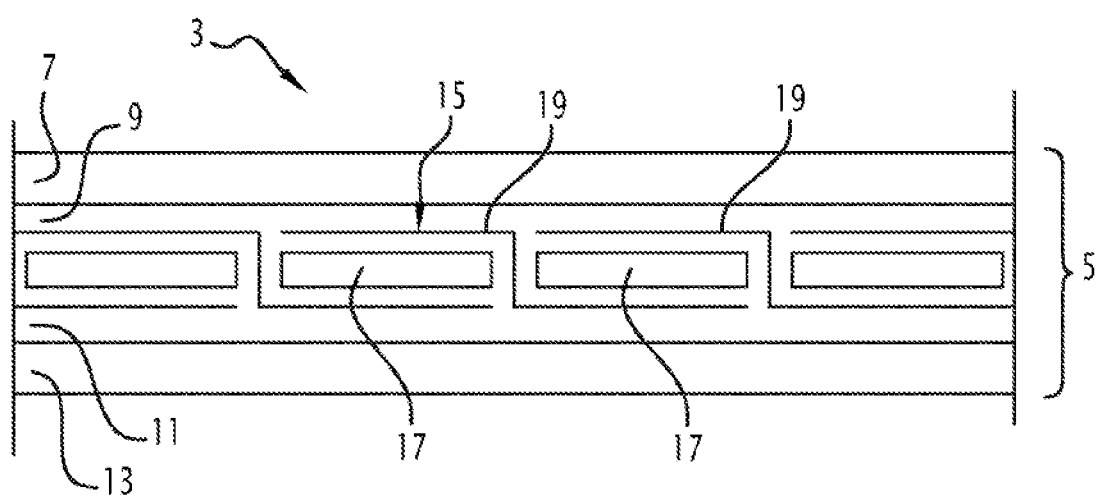
FIG. 3 shows a section of a photovoltaic stack that can be manufactured through the installation of FIGS. 1 and 2.

As illustrated in FIG. 3, each photovoltaic panel 3 produced by the facility 1 comprises a stack of successive layers, referred to hereinafter as a "photovoltaic stack 5". The photovoltaic stack 5 comprises a first layer 7 that is intended to form the front face of the photovoltaic panel 3 and to be oriented to face the light source. The first layer 7 is, for example, made of glass or any other suitable transparent and rigid material. The photovoltaic stack 5 also comprises a second layer 9, which constitutes an encapsulating layer deposited against the first layer 7. The stack 5 also comprises a third layer 11, which forms a second encapsulation layer, preferably made of the same material as that of the first layer 7. This material is preferably a polymer capable of undergoing a lamination treatment while being transparent. This encapsulating material is, for example, ethylene vinyl acetate (EVA). Between the layers 7 and 9 are encapsulated chains 15 of photovoltaic cells 17. A single chain 15 is visible in FIG. 3. Each chain 15 comprises a plurality of photovoltaic cells 17 and interconnection bars 19, sometimes called "busbars" or copper bars that electrically connect two cells in pairs to form the chain 15. The photovoltaic stack 5 further comprises a fourth layer 13 opposite the first layer 7, and arranged against the third layer 11. The fourth layer 13 constitutes the rear face of the photovoltaic panel 3 and may be made either of the same material as the layer 7, or of a different material, but that is rigid and opaque. This material preferably comprises polyvinyl fluoride. This material is, for example, the material marketed, in particular, under the trademark TEDLAR®. Optionally, the fourth layer 13 may be a composite material including polyvinyl fluoride as well as other constituents such as aluminum or polyester. The stack 5 may comprise additional layers, depending on the intended application for the photovoltaic panel 3.

As shown in FIGS. 1 and 2, the facility 1 comprises a peripheral fence 21 delimiting a closed contour in which the photovoltaic panel 3 is manufactured automatically, so that during normal operation of the facility 1, user U intervention is performed exclusively from outside the peripheral fence 21, in particular for security reasons. The fence 21 has a generally polygonal shape and has eight vertices 21A, 21B, 21C, 21D, 21E, 21F, 21G and 21H. The vertices 21C, 21D, 21E and 21F are arranged in a rectangle. The vertices 21B and 21G are arranged between the vertices 21C and 21F and are distributed parallel to these vertices 21C and 21F. The vertices 21A and 21H form a rectangle with the vertices 21B and 21G.

The facility 1 comprises a main entrance 23, arranged between the vertices 21B and 21C and through which a layer 7 that is intended to belong to a photovoltaic stack 5, may be inserted inside the peripheral fence 21. In this housing, the main entrance 23 comprises a rotating plate to supply the installation 1 with the first layers 7. The orientation of the rotating plate at the main entrance 23 is in a direction of rotation R23.

The facility 1 also includes a main exit 25 for the photovoltaic panels 3 manufactured within the installation.

The main exit 25 is arranged between the vertices 21F and 21G. The main exit 25 also comprises a rotating plate in the direction of rotation R25.

The facility 1 comprises three robots 27, 29 and 31 arranged inside the fence 21. These robots 27, 29 and 31 serve both for the conveyance and for the manufacture of the panels 3. Each of these three robots 27, 29 and 31 preferably forms a robotic arm independent of the other two, and independently programmable. Each robotic arm has several articulated limbs. The robots 27 and 31 are able to pick up and move photovoltaic stacks 5 one by one during manufacture, by way of the layer 7 of the stacks. In general, each of the robots 27 and 31 orients the layer 7 horizontally with respect to the ground, so that the layer 7 is used as a support for the other components of the photovoltaic panel 3 during all or part of the manufacture of the latter. The robot 29 itself is provided to pick up and move the sealed housings 47 one by one as detailed below.

In a first step, the robot 27 picks up a layer 7 at the main entrance 23 and moves it to a stacking machine 33 in the direction of the arrow D1 shown in FIG. 2. The machine 33 is arranged near the vertex 21D. The machine 33 deposits the layer 9 on the layer 7 supported by the robot 27. To do this, the robot 27 synchronously orients and moves the layer 7 relative to the machine 33, in order to position the layer 7 under the layer 9, while the layer 9 is unwound from a storage reel by the machine 33. The displacement of the layer 7 by the robot 27 relative to the machine 33 and the ground allows the correct positioning of the layer 7 under the layer 9, before the layer 9 is released by the machine 33. The layers 7 and 9 then form a photovoltaic stack 5, which will be completed, as described below, in order to form a photovoltaic panel 3 at the end of manufacture.

The user can access the machine 33 via a door 22 formed in the fence 21, in particular for the supply and/or maintenance of this machine 33.

The robot 27 then moves this stack 5 to a machine 35 in the direction of the arrow D2. The machine 35 is positioned near the entrance 23 on one side of the fence 21 extending between the vertices 21D and 21E. The machine 35 is designed to interconnect the photovoltaic cells 17 and thus form chains 15 of photovoltaic cells 17. The machine 35, described in more detail below, deposits the chains 15 on the second layer 9. While the chains 15 are being deposited by the machine 35, the robot 27 synchronously moves the stack 5 in order to distribute the chains 15 in a predetermined arrangement on the upper free surface of the layer 9.

The robot 27 then pivots the stack 5 a quarter of a turn in order to deposit and solder additional interconnection bars 19 and connect the chains 15 of photovoltaic cells 17 to each other and thus close a circuit of cells 17 formed on the stack 5. Some of the bars 19 of the circuit of the stack 5 form output bars of the future panel 3, and are referenced and maintained by a tool of the facility 1.

The robot 27 then again moves the photovoltaic stack 5 to the machine 33 in the direction of the arrow D3. According to the same principle as for the deposition of the layer 9, the machine 33 deposits the third layer 11 over the photovoltaic stack 5, while this stack 5 is supported and positioned by the robot 27 relative to the machine 33. Orifices are formed through the layer 11 through which the output bars are passed while they are still held by the aforementioned tools.

The robot 27 then moves the stack 5 along the arrow D4 to a stacking machine 37 of the fourth layer 13, similar to the machine 33. The machine 37 is arranged between the machine 33 and the vertex 21E opposite the vertex 21D. The deposition of the fourth layer 13 is carried out according to the same principle as the deposition of the layers 9 and 11.

The user U can access the machine 37 via a door 24 formed in the fence 21, in particular for the supply and/or maintenance of this machine 37.

The robot 27 then moves the photovoltaic stack 5 along the arrow D5 to a lamination system 39, which is described in more detail below. The lamination system 39 comprises the robot 29, which is responsible for handling the stack 5 in the lamination system 39. Once the lamination has been performed, the robot 29 transfers the stack 5 to the robot 31 in the direction of the arrow D6.

According to the arrow D7, the robot 31 moves the laminated photovoltaic stack 5 to a machine 41 for deburring and integration of junction housings in the photovoltaic stack 5. The machine 41 adds and secures the junction housings on the stack 5, while the stack 5 is moved by the robot 31 relative to the machine 41, so that the movement of the robot enables the junction housings to be arranged on the stack 5.

The user U can access the machine 41 through the doors 26 formed in the fence 21, in particular for the supply and/or maintenance of this machine 41.

The stack 5 and the junction housing(s) added thereto together form a photovoltaic panel 3.

Optionally, the facility 1 may comprise a station (not shown) for finishing the photovoltaic panel 3.

Finally, the robot 31 moves the photovoltaic panel 3 to the main exit 25, so that it may be extracted by the user U.

The robots 27 and 31 are therefore designed to position and/or move the photovoltaic stack 5 while the machines 33, 35, 37 and 41 operate on this stack 5, wherein the robots 27 and 31 are also programmed to impart a displacement to the 5, or a feed movement relative to the machine 33, 35, 37 or 41 in question, while this machine operates on the stack 5. Thus, the design of the machines 33, 35, 37 and 41 is simplified.

Figure 4:
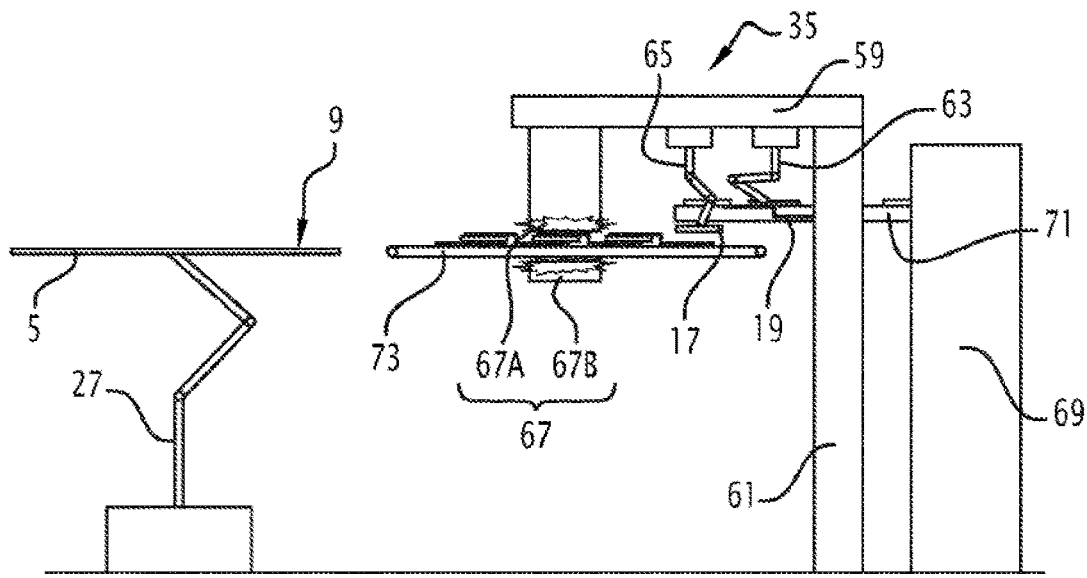
FIGS. 4 and 5 show two schematic elevational views of an interconnection machine or chaining belonging to the installation of FIGS. 1 and 2.
Figure 5:
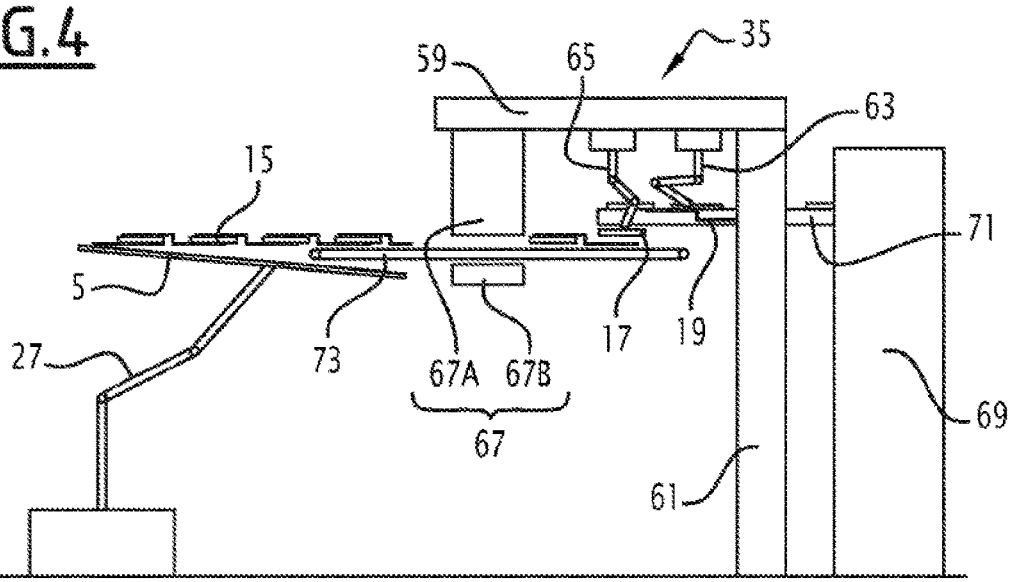

As illustrated in FIGS. 4 and 5, the machine 35 for interconnecting or linking the cells 17 comprises a bracket 59 which rests on the ground via a pillar 61. The bracket 59 and the pillar 61 are omitted from FIG. 6.

The bracket 59 supports two robots 63 and 65 of the machine 35. The robots 63 and 65 are in this housing suspended from the bracket 59 and directed downwards, wherein each robot 63 or 65 forms, for example, a robotic arm with several members. The bracket 59 also supports a welding device 67 that is able to weld the photovoltaic cells 17 to the interconnection bars 19.

The machine 35 also comprises a distributor 69 of photovoltaic cells 17. In this example, the distributor 69 comprises a conveyor 71. The facility 1 also comprises a device 75 for preparing the interconnection bars 19 and that is described in greater detail below, and which is advantageously included in the machine 35, in order to supply the conveyor 71 with interconnection bars 19. The conveyor 71 is able to position a photovoltaic cell 17 in an area accessible by the robot 65, while, at the same time, positioning a bundle of interconnection bars 19 in an area that is accessible to the robot 63. In this example, the bundle of interconnection bars 19 comprises three interconnection bars 19, each of which is intended to electrically connect two cells 17 together.

The machine 35 also comprises a receiving support 73, which is supported at the level of the welding device 67, and, in particular, between an upper jaw 67A and a lower jaw 67B of the latter, by being fixed to the bracket 59 of the machine 35. The receiving support 73 preferably comprises a conveyor on which a chain 15 is intended to rest during manufacture.

The machine 35 is preferably designed to make one chain at a time. For this, the robot 65 first picks up a first cell 17 on the conveyor 71 and places it on the receiving support 73. In parallel, the robot 63 picks up a first bundle of interconnection bars 19 and positions this first bundle on the receiving support 73, while arranging the bars 19 of the first bundle in their final position in the chain 15 relative to the first cell 17. In practice, the interconnection bars 19 of the first bundle are then in contact with an upper face of the first cell 17. The conveyor of the receiving support 73 moves the first cell 17 and the first bundle of bars 19 in order to position the first cell 17 between the upper jaw 67A and the lower jaw 67B of the welding device 67. The welding device 67 then performs welds to electrically connect the first bundle of interconnection bars 19 to the upper face of the first photovoltaic cell 17.

While this welding is being carried out, or once this welding is completed, the robots 63 and 65 take up a second photovoltaic cell 17 and a second bundle of interconnection bars 19 in order to position them on the receiving support 73. More specifically, the robot 65 deposits the second cell 17 on the first bundle of bars 19 so that a lower face of the second cell 17 is in contact with the bars 19 of the second bundle. The robot 63 then deposits the second bundle of bars 19 on the second cell 17, so that the bars 19 of this second bundle are in contact with an upper face of the second cell 17. The conveyor of the receiving support 73 advances a further step in order to bring the second cell 17 between the jaws of the welding device 67, so that the latter can weld both the first bundle 19 with the second cell 17, thanks to the lower jaw 67B, and the second bundle 19 with the second cell 17, thanks to the upper jaw 67A.

By repeating these operations for all the photovoltaic cells 17 and all the bundles of bars 19 that the chain 15 must contain during manufacture, the machine 35 builds the entire chain 15.

Figure 6:
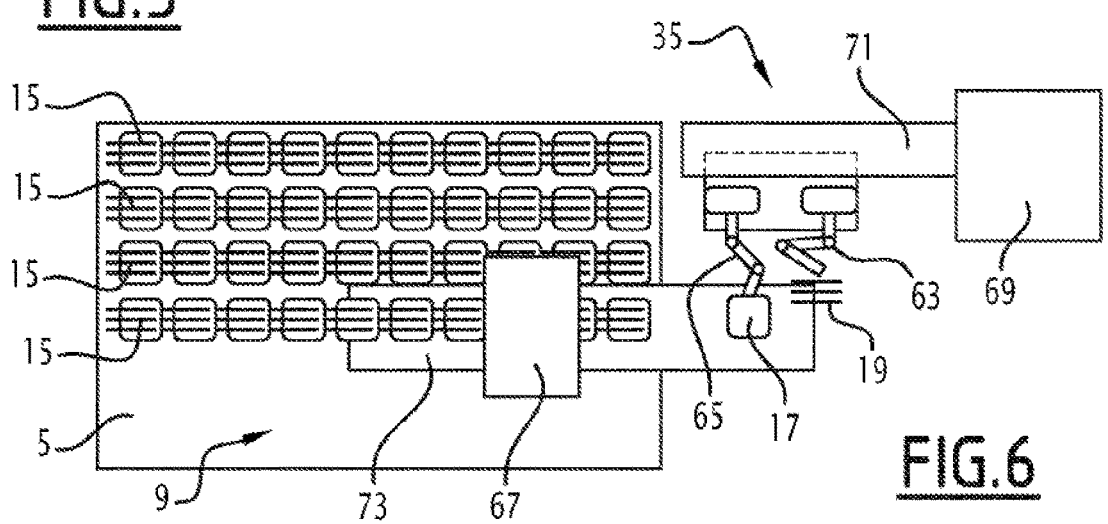
FIG. 6 shows a schematic view from above of the interconnection machine of FIGS. 4 and 5.

Once the chain 15 is completed, its components 17 and 19 welded together, or during the production of the chain 15, the robot 27 presents the stack 5 under the receiving support 73, so that an edge of this stack 5 corresponds to one end of the chain 15. The stack 5 may be arranged below the receiving support 73 thanks to the robot 27, and the fact that the support pillar 61 of the bracket 59 is offset relative to the receiving support 73. The end of the chain 15 is deposited first on the stack 5, wherein the robot 27 then moves the stack 5 in order to synchronously accompany the deposition of the remainder of the chain 15 at the other end of the latter, as shown in FIGS. 5 and 6.

Each chain 15 that is intended to belong to the stack 5 is manufactured sequentially and deposited on the stack 5 according to the method described above. The chains 15 are arranged parallel to each other in this housing and are distributed over the surface of the layer 9.

In parallel with the distributor 69, the facility 1 comprises the device 75 for preparing the interconnection bars 19, and which is advantageously included in the machine 35, as illustrated in FIGS. 1 and 2. Alternatively, the device 75 may be separate from the machine 35, as illustrated in FIGS. 7 to 17.

The device 75 comprises a turnstile 77, which is rotatable relative to the ground about a vertical axis X77. The rotation of the turnstile 77 about its axis X77 is indexed according to four distinct positions, for example. The turnstile 77 has four sets 79 of wire coils. The wire of each coil is intended to form one of the aforementioned interconnection bars 19. In the present example, three interconnection bars 19 are provided to form a bundle connecting two photovoltaic cells 17 together, and each set 79 comprises three coils so that three wires may be cut in parallel. In each indexed orientation of the turnstile 77 about its axis X77, three sets 79 are accessible to the user U from a feed zone 81 of the facility 1 (visible in FIG. 2), and located between the vertices 21A and 21B. The feed zone 81 is itself accessible via a door 82 that is normally closed. The user U can change, as necessary, the coils of the three sets 79 via this accessible feed zone 81. For each orientation of the turnstile 77, the last of the four sets is engaged in the device 75.

The engaged set 79 is visible in FIGS. 7 to 17. The end of the wire of each coil of the engaged set 79 is passed through return pulleys 83 located directly above the turnstile 77. The device 75 comprises a fixed clamp 85 and a movable clamp 87 arranged vertically and below the fixed clamp 85. Each of the clamps 85 and 87 is designed to move between an open configuration, in which the passage of the wires is left free, and a closed position by clamping the wires through pinching.

Figure 7:
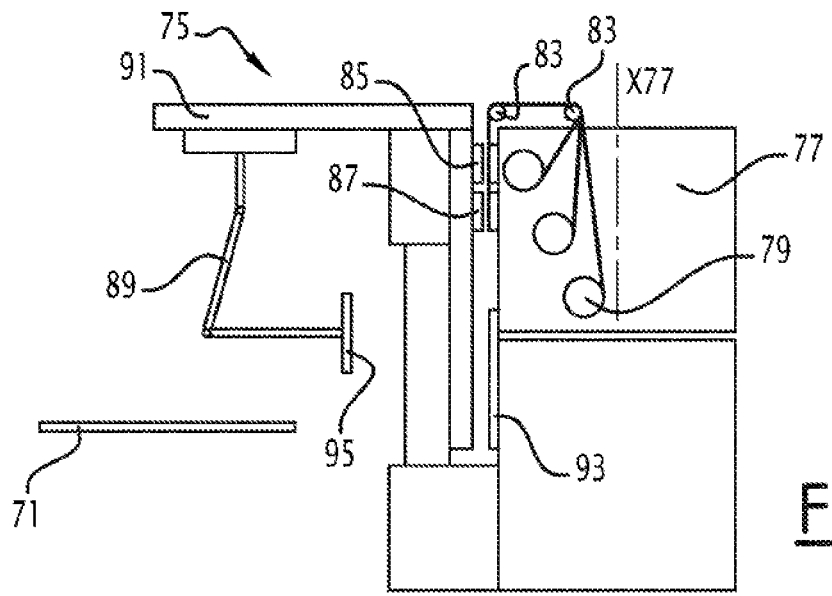
FIGS. 7 to 17 show schematic views of a device for preparing interconnection bars, wherein this device belongs to the installation of FIGS. 1 and 2 and represented during several operating steps.
Figure 8:
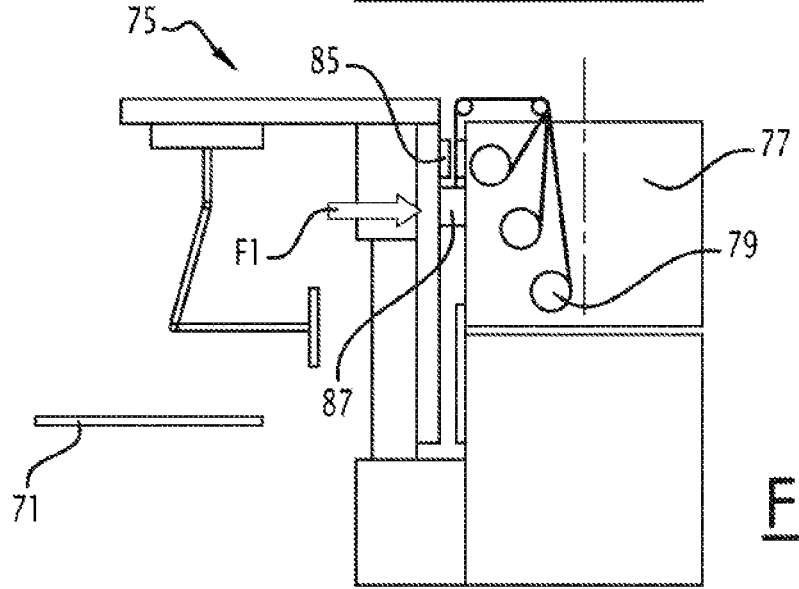
Figure 9:
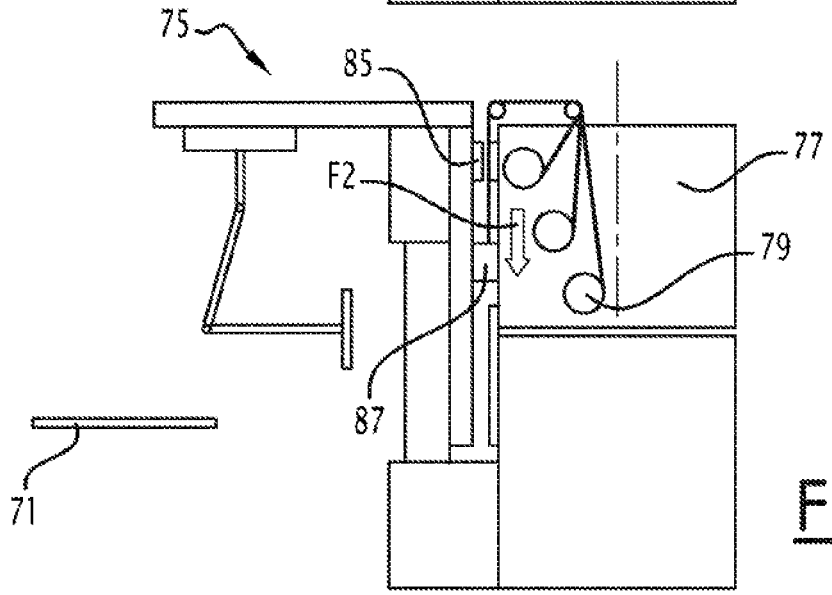
Figure 10:
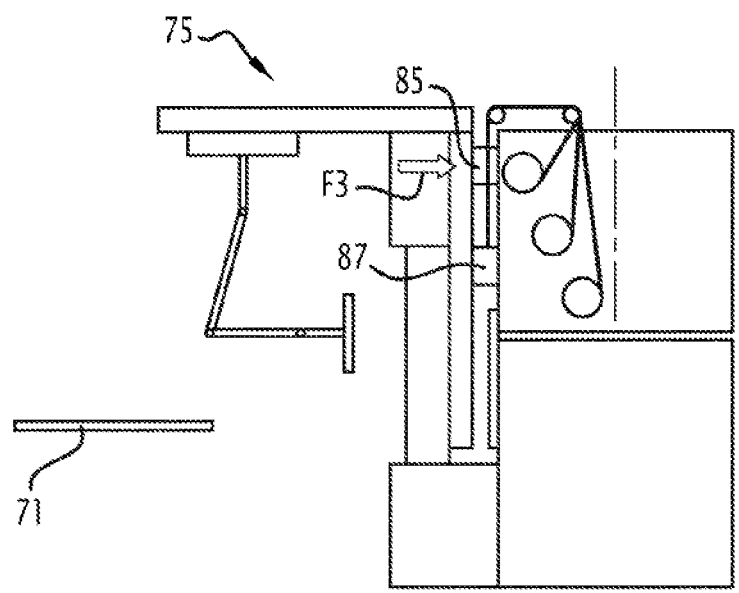
Figure 11:
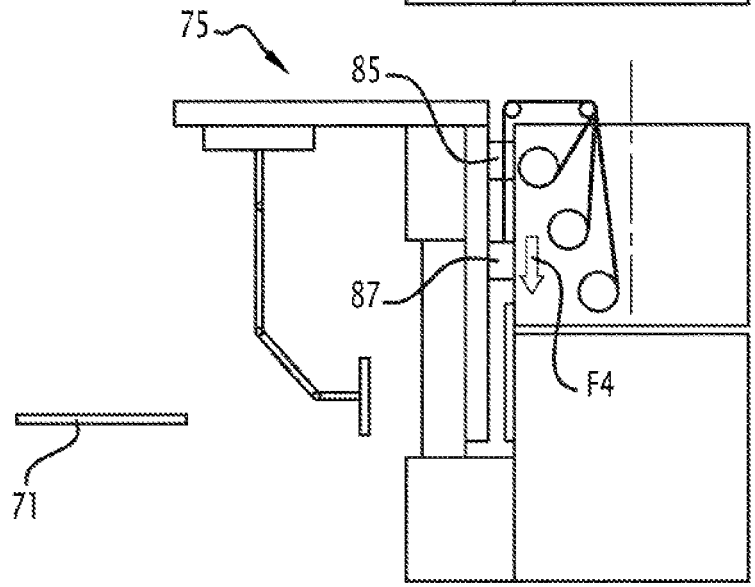
Figure 12:
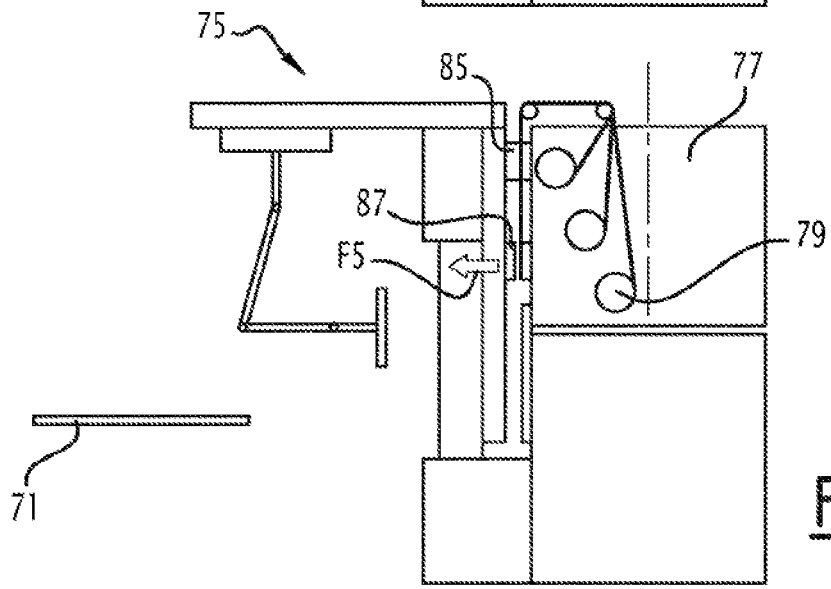
Figure 13:
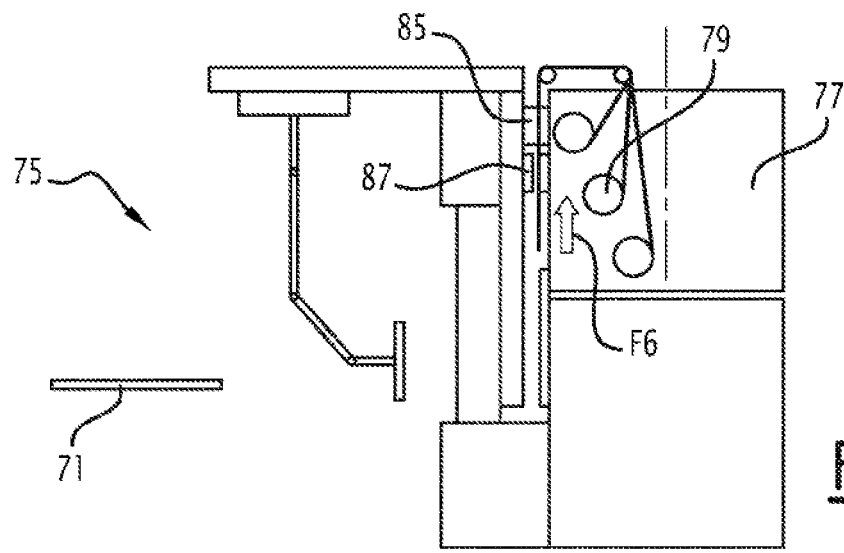
Figure 14:
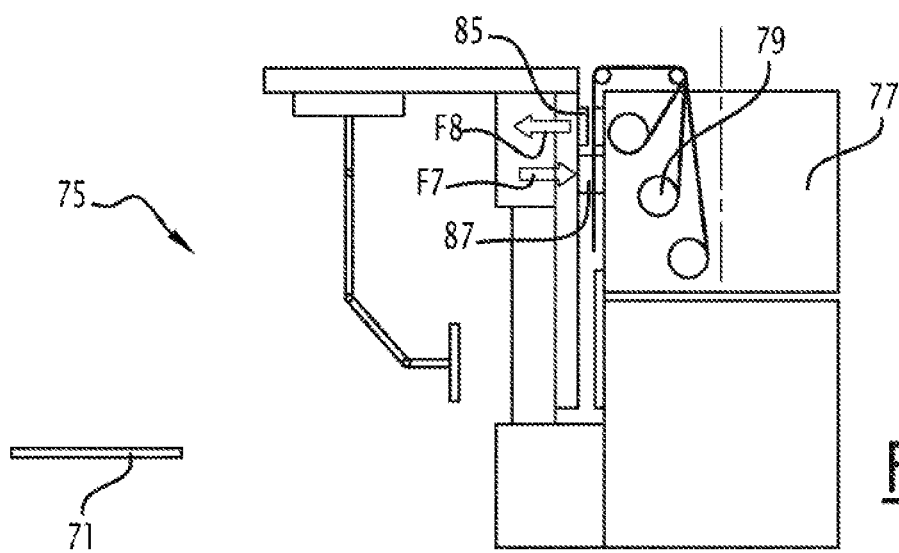
Figure 15:
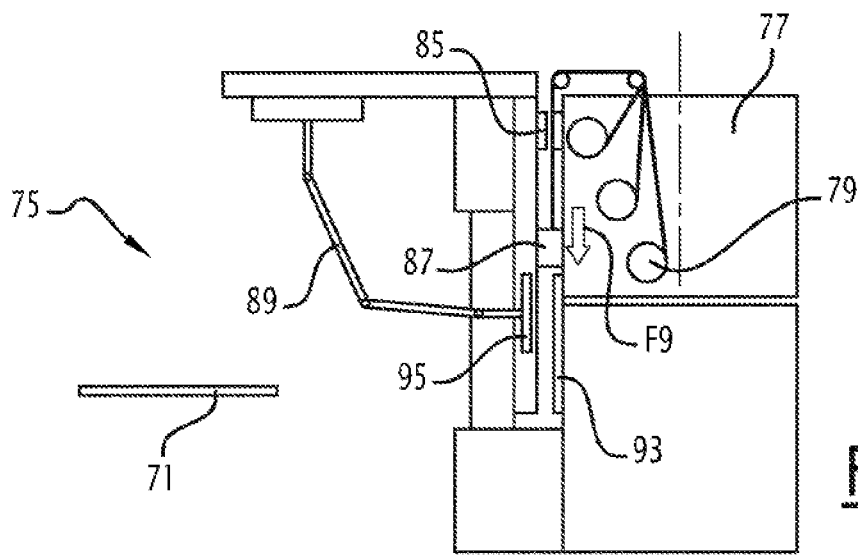

In a first operating step, visible in FIG. 7, the return pulleys 83 direct the ends of the three wires of the coils of the engaged set 79 through the fixed clamps 85 and mobile clamps 87, which are initially in open configuration, as illustrated in FIG. 7. The wire of the three coils of the engaged set 79 descends substantially vertically through the clamps 85 and 87. Then, as shown in FIG. 8, the mobile clamp 87 closes on the three wires in order to grip these in the direction of the arrow F1. As illustrated in FIG. 9 by the arrow F2, the mobile clamp 87 then moves downwards away from the fixed clamp 85, in order to drive the three wires and thus unwind a predetermined length of wire. Once the predetermined length of wire has been unwound, the mobile clamp 87 is immobilized and the fixed clamp 85 closes in the direction of the arrow F3, as illustrated in FIG. 10, in order to delimit a portion of wire for each of the three wires. As illustrated in FIG. 11 by the arrow F4, the mobile clamp 87 exerts a tension on the three parallel portions of wire in order to produce an elongation of each of these portions. As illustrated in FIG. 12 by the arrow F5, the mobile clamp 87 is then opened and brought close to the fixed clamp 85 as shown in FIG. 13 along the arrow F6. As illustrated in FIG. 14, the mobile clamp 87 is closed according to the arrow F7, while the fixed clamp 85 is open according to the arrow F8. The mobile clamp 87 is then translated downwards along the arrow F9, in order to place the elongated and straightened portions of the wires against a plate 93 as shown in FIG. 15. The plate 93 forms a stamp that can pick up, form and cut the wires by pressure with a counter-stamp 95.

Figure 16:
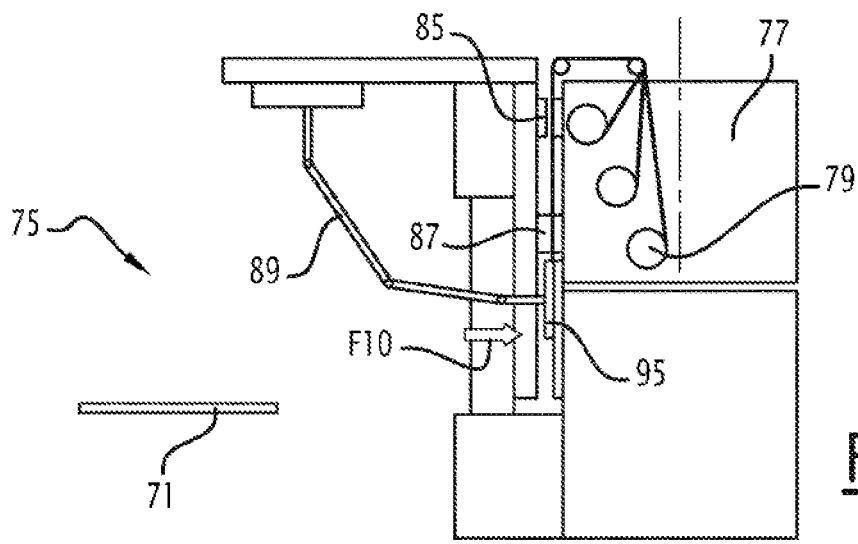
Figure 17:
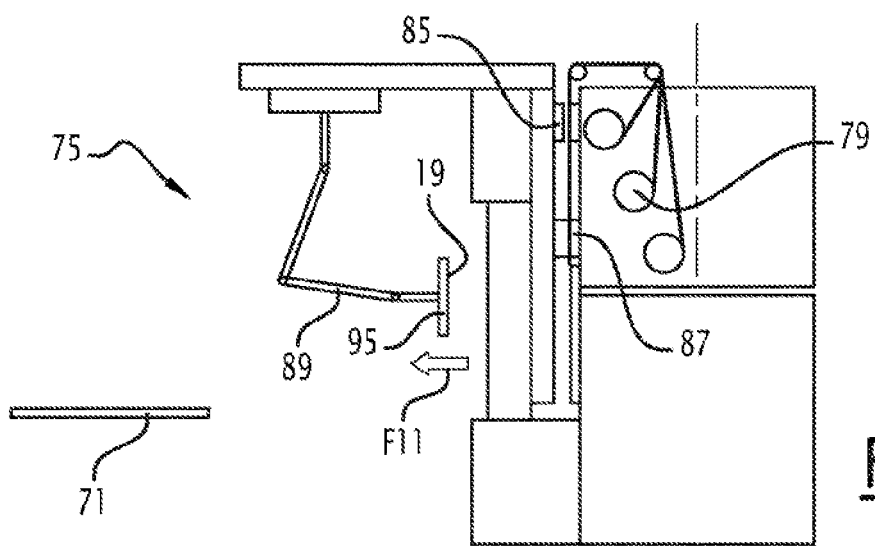

The device 75 also comprises a robot 89 that is constituted, for example, by a robotic arm with several members, wherein the robot 89 is suspended from a bracket 91 of the device 75. As illustrated in FIG. 16, the counter-stamp 95 that is supported at the end of the robot 89, is brought closer and pressed against the plate 93 by the robot 89, as represented by the arrow F10, in order to deform the elongated portions of the three wires into a predetermined shape. At the same time, the deformed portions are cut by being pressed against the counter-stamp 95 in order to form three interconnection bars 19 constituting a bundle. Finally, as illustrated in FIG. 17 along the arrow F11, the counter-stamp 95 is moved away from the plate 93 by the robot 89 and carries with it the bundle of the three interconnection bars 19 thus formed. The robot arm 89 then disposes these interconnection bars 19 on the conveyor 71.

FIGS. 18 to 22 illustrate more specifically the lamination system 39. The lamination system 39 can laminate several photovoltaic stacks 5 at the same time (only one of these is illustrated). The system 39 can also laminate a single stack 5 at a time.

The system 39 comprises a docking station 43 with several receiving compartments 45 vertically arranged one above the other and each comprising an access opening from outside the docking station 43. Each access opening is advantageously closable by a door (not shown). The docking station 43 comprises heating means 46, so that the receiving compartments 45 form heating compartments 45 in this housing, each of which delimits an internal heating volume independent of that of the other heating compartments 45. The heating means 46 are, in the example of FIG. 18, formed by independent heating resistors arranged in each of the compartments 45. Alternatively, the heating means may be formed by any heating system adapted to the application, such as a heat transfer fluid system. Whatever the variant, the system 39 preferably comprises a control system, for example an electronic control system, for the heating means 46.

The heating means 46 of each heating compartment 45 are designed to carry out heating that is intended to obtain crosslinking of the layers 9 and 11 of one or more photovoltaic stacks 5. Optionally, the docking station 43 may be configured so that the heating of each compartment 45 by the heating means 46 is independent of the heating of the other compartments 45. Thus, for example, the heating means 46 may heat a first of the compartments 45, while a second of the compartments 45 is not heated at the same time.

Figure 18:
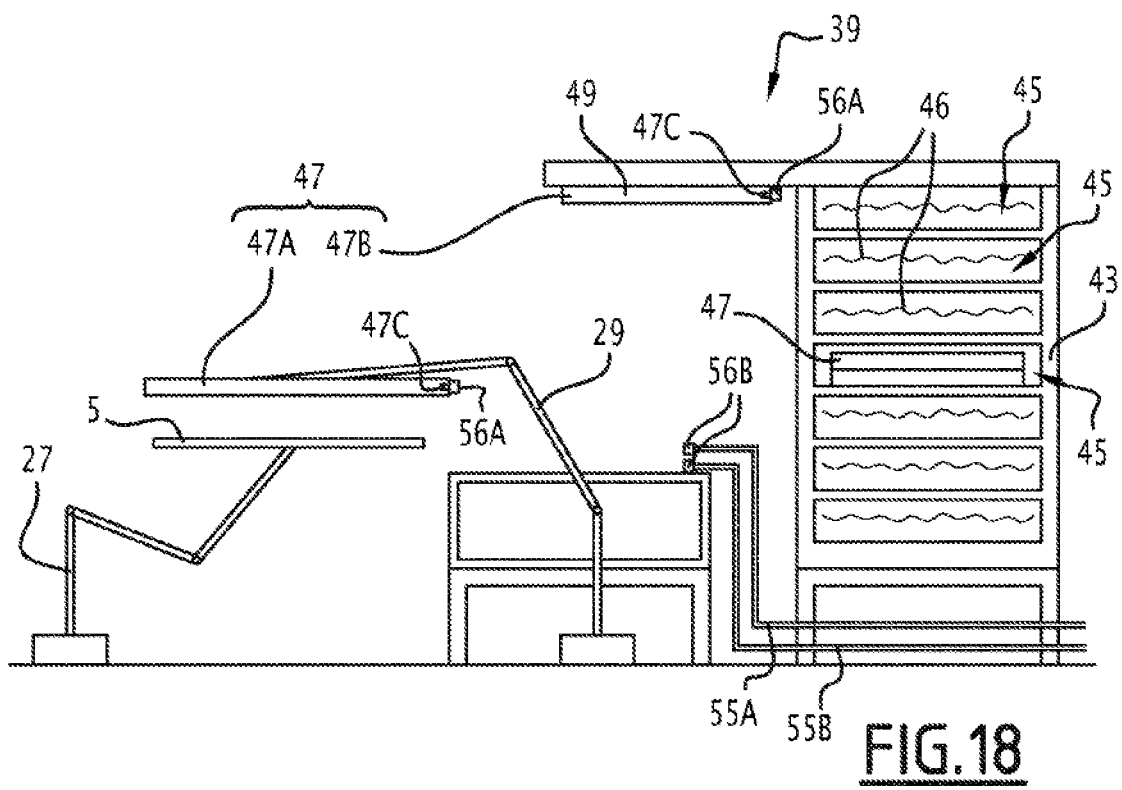
FIGS. 18 to 22 show schematic views of a lamination system according to the invention, shown in several stages of operation.
Figure 21:
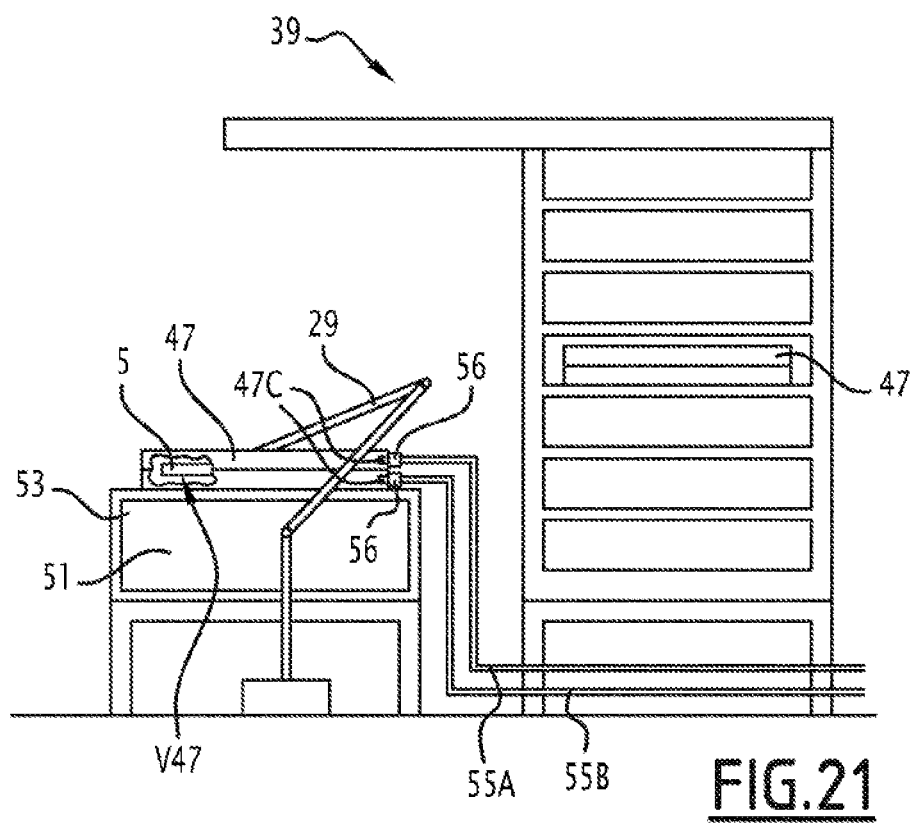

The lamination system 39 also comprises a plurality of autonomous and separate sealed housings 47, two of which are illustrated in the figures. Each housing 47 forms an element independent of the receiving station 43, and that is movable relative to the latter by the robot 29. Each housing 47 comprises a shell or rigid envelope. The housings 47 are independent of each other, so that they may, in particular, be moved separately from each other. Each compartment 45 is designed to accommodate a single housing 47, or alternatively several housings 47. Each housing 47 comprises a base 47A and a cover 47B, which are designed to move between a closed configuration and an open configuration. The base 47A and the cover 47B form the aforementioned rigid shell of the housing 47. One of the two housings 47 shown in FIG. 18 is in the closed configuration and is arranged in one of the heating compartments 45. In the closed configuration, the base 47A and the cover 47B together define an internal volume V47 of the housing 47 that is designed to contain the photovoltaic stack 5. In FIG. 21, the internal volume V47 is shown by pull-out. The shape of the internal volume V47 thus allows, in this example, a single photovoltaic stack 5 to be contained at one time, wherein the internal volume may be designed to contain several at one time. In closed configuration, the internal volume V47 of the housing 47 is sealed and may, in particular, be put under vacuum. In particular, the housing 47 in closed configuration is enabled to maintain a constant pressure level in its internal volume V47 and, in particular, to maintain a vacuum with respect to the outside. In FIG. 18, the second housing 47 is shown in open configuration, wherein its base 47A is supported by the robot 29 and its cover 47B is fixed to a bracket 49, which is mounted at the top of the docking station 43. In open configuration, the base 47A and the cover 47B are separated and independent of one another.

More specifically, the internal volume V47 comprises two chambers separated by a membrane. The membrane is, for example, provided within the base 47A in order to seal off the opening of the base 47A and to arrange one of the chambers of the housing between the membrane and the bottom of the base 47A. The other chamber, intended for the reception of the photovoltaic stack 5, is then formed between this cover and the membrane of the base 47A when the cover 47B is closed. Each sealed housing is designed to maintain the pressure difference between the outside and each chamber of its internal volume V47, but also between each of these chambers, wherein the membrane itself is sealed.

Figure 19:
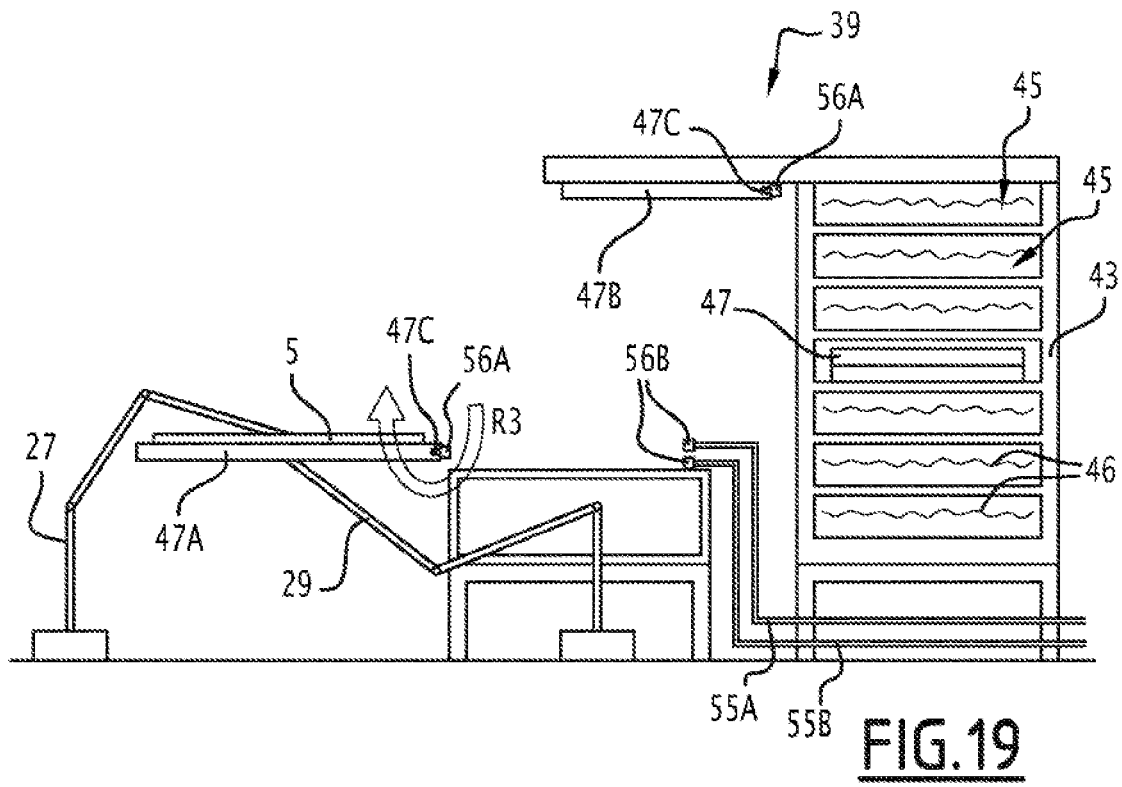
Figure 20:
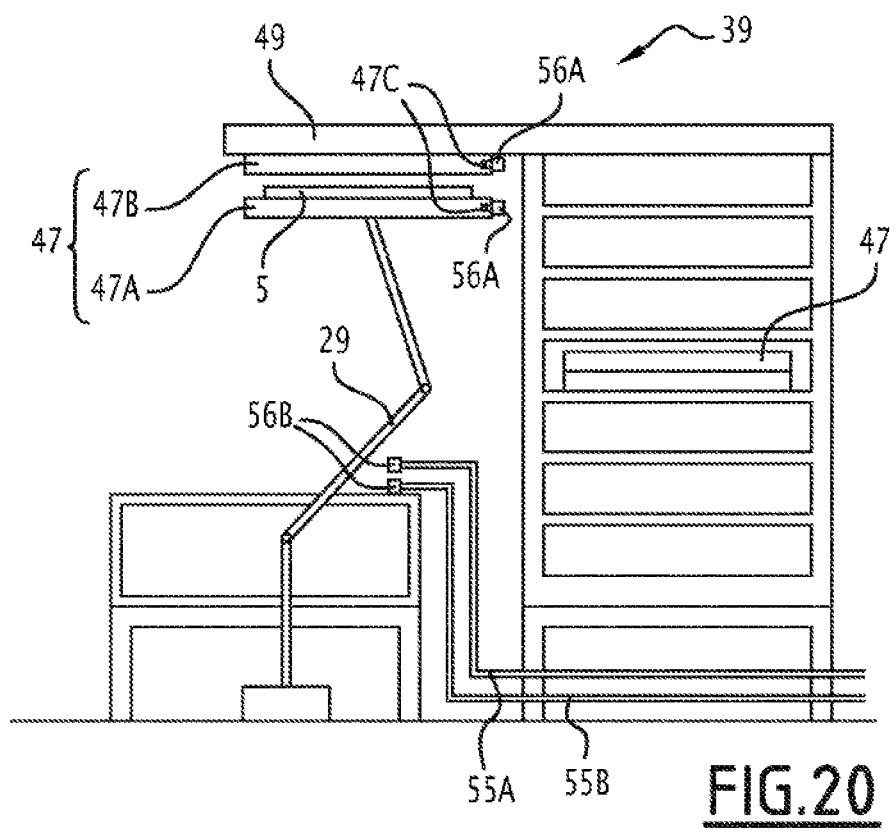

Alternatively, the membrane is arranged in the cover 47B and not in the base 47A. The two robots 27 and 29 are programmed to introduce the photovoltaic stack 5 in the internal volume V47 of the sealed housing 47, while this sealed housing 47 is outside the docking station 43, or any other device, and in open configuration. As illustrated in FIG. 18, after the stack 5 has been moved in the direction of the arrow D5, the robot 27 supports the photovoltaic stack 5 from below in the vicinity of the robot 29. The robot 29 approaches the base 47A of the housing 47 vertically above the photovoltaic stack 5 and until it contacts the stack 5 with the base 47A, specifically with the membrane. Once this contact is established, as illustrated in FIG. 19, the robots 27 and 29 cooperate to turn, in the direction of the arrow R3, the assembly formed by the base 47A and the stack 5, so that the stack 5 is located above the base 47A, while the contact between the stack 5 and the base 47A is maintained during the reversal along the arrow R3. Then, as illustrated in FIG. 20, the robot 29 approaches the assembly 5 and 47A of the cover 47B fixed on the bracket 49 and makes the housing 47 pass to the closed configuration by placing the base 47A in contact with the cover 47B and temporarily securing it. Temporary joining of the base 47A with the cover 47B may be carried out using any appropriate means.

In one variant, the base 47A and the cover 47B are fixed to each other even when the housing is in the open position, so that, in this housing, the robot 29 can support the housing 47 in its entirety, in the open configuration as well as in the closed configuration.

The lamination system 39 also comprises a device for putting the internal volume V47 of the housing 47 under vacuum, when the housing 47 is in the closed configuration.

In a first embodiment illustrated in FIG. 21, the vacuum device comprises a vacuum station 51 placed outside the receiving station 43 and including, for example, a table 53 on which a sealed housing 47 enclosing a photovoltaic stack 5 may be deposited by the robot 29. The vacuum station 51 also comprises two lines 55A and 55B, each of which is connected to an independent vacuum source to put the sealed housing 47 under vacuum. The lines 55A and 55B are connected to the housing 47 during the entire stage of producing a vacuum and are then disconnected from the latter. Preferably, the robot 29 connects and disconnects the lines 55A and 55B with the housing 47 by moving the housing 47 relative to the station 51. Quick connectors 56 are provided for fluidically connecting the elements 47, 55A and 55B. Each connector 56 comprises a first connector 56A opening into an opening 47C of the housing 47, and a second connector 56B complementary to the first connector 56A, allowing the connectors 56A and 56B to be connected and disconnected. One of the openings 47C of the housing 47 is, for example, formed by the cover 47B, in order to open into one of the chambers of the internal volume V47 of the housing 47, while the other opening 47C of the housing 47 is formed in the base 47A in order to open into the other chamber of the housing 47. The putting of the housing 47 under vacuum may be performed through these openings 47C via the 56A connectors when the housing 47 at the station 51 is in the closed configuration. The openings 47C make it possible to put each chamber of the internal volume V47 independently under vacuum. Preferably, the respective value of the pressure within each chamber of the internal volume V47 is separately controlled via the lines 55A and 55B so that the membrane is pressed against the stack 5 upon production of the vacuum. In other words, by application of a pressure difference in the two chambers, and, in particular, the putting under vacuum of the chamber which contains the stack 5, the membrane squeezes the stack 5 to laminate the latter, when heat is also provided to the stack 5, as described below.

According to the variant intended for the sealed housing 47, in particular concerning the number of chambers of the internal volume V47, the number of openings 47C, connectors 56 and lines 55A and 55B may be modified. In particular, provision is made for each housing 47 to have at least one opening 47C, which may be connected to a connector 56 to a line 55A.

The vacuum device 51 optionally comprises a preheating means (not shown) that is distinct from the receiving station 43 for preheating the stack 5 contained in the housing 47 before it is introduced into the receiving station 43.

Figure 22:
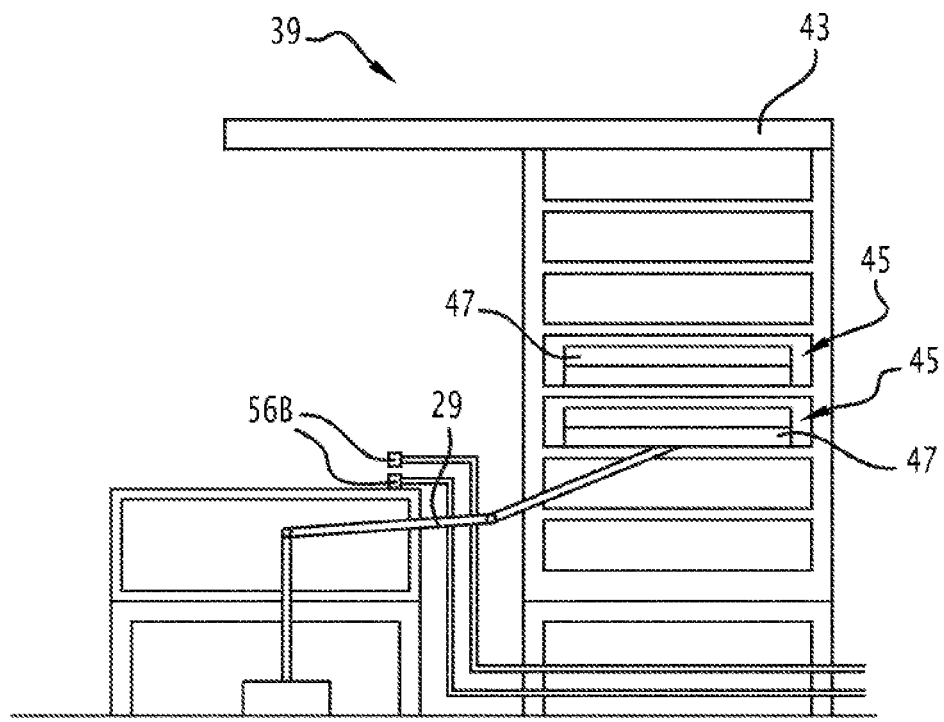

In this embodiment, after the production of the vacuum, the housing 47 containing the photovoltaic stack 5 is transferred by the robot 29 into one of the heating compartments 45 of the receiving station 43, as shown in FIG. 22. The robot 29 therefore constitutes a device for transferring the sealed housing 47 into the heating compartment 45. In the closed configuration, the sealed housing 47 retains the pressure or vacuum value established in each of the chambers of its internal volume V47, even when it is separated from the vacuum station 51 and, in particular, the connectors 56. Thus, it is not necessary for the heating compartments 45 themselves to be under vacuum or at a particular pressure value in order to perform the lamination of the photovoltaic stacks 5. In particular, the compartments 45 are at atmospheric pressure, so that the sealed housings 47 may be introduced or removed from the heating compartments 45 at any time. The housings 47 may advantageously be introduced sequentially into the receiving station 43, independently of each other. Optionally, the temperature of the heating means 46 of each respective compartment 45 may be independently adjusted for each compartment 45 in order to tailor the temperature to which each housing 47 is subjected.

As the housing 47 is in its compartment 45, the photovoltaic stack 5 is heated while it is contained under vacuum in the internal volume V47 of the sealed housing 47, so that the photovoltaic stack 5 is laminated.

In a next step, the robot 29 removes one of the housings 47 from its heating compartment 45 when the lamination for this particular housing 47 is complete. The robot 29 thus also serves as a device for transferring the sealed housing(s) out of the compartment 45. At this point, the lamination process of the other stacks 5 that are possibly present in the receiving station 43, is not disturbed.

The internal volume V47 of the housing 47 removed from the receiving station 43 is then ventilated, either by the robot 29 or at the vacuum station 51. The robot 29 then passes the housing 47 from its closed configuration to its open configuration so that the robot 31 can extract the laminated photovoltaic stack 5 from the housing 47 in open configuration, while this housing 47 is supported by the robot 29.

The lamination system 39 thus advantageously operates according to a so-called "first-in, first-out" stack of sealed housings 47 in the receiving station 43, wherein this stack is dimensioned by the residence time required for the lamination of each sealed housing 47 in each station 43, as well as the desired production rate for the photovoltaic panels.

In one variant, the heating means 46 are provided on-board within each housing 47, rather than in the receiving station 43. In this variant, the heating means of each housing 47 are preferably supplied with energy at the same time by using electrical connectors, or heat transfer fluid connectors provided in the receiving compartments 45 of the receiving station 43. In practice, the heating means 46 provide heat within their respective housing 47 when the latter is contained in the receiving compartment 45 in question in order to heat the photovoltaic stack 5 contained in the housing 47.

Figure 23:
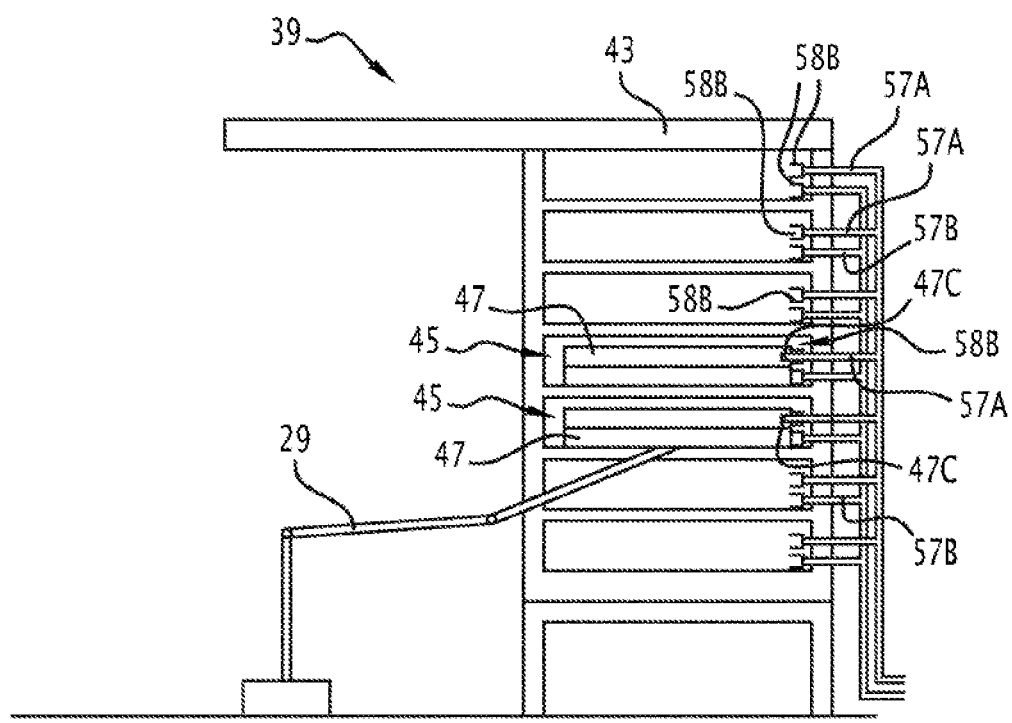
FIG. 23 shows another embodiment of the lamination system of FIGS. 18 to 22.

According to a second embodiment illustrated in FIG. 23, the lamination system 39 comprises a plurality of internal line pairs 57A and 57B, each of which opens into one of the compartments 45 of the receiving station 43, so that that each sealed housing 47 introduced into one of the compartments 45 may be connected to one of the internal line pairs 57A and 57B, in order to see its internal volume V47 within the compartment 45 put under vacuum. In particular, each internal line pair 57A and 57B is provided with an internal connector 58B located in the compartment 45 in question, in order to respectively connect the cover 47B and the base 47A. Each internal connector 58B is compatible with one of the connectors 56A of the housings 47 and may be fluidly connected and disconnected from the latter, so that each connector 58B of each compartment 45 allows one of the two chambers of the housing 47 in question to be put under vacuum via the opening 47C of this chamber.

In one variant, as many connectors 58B are provided in each compartment 45 as openings 47C are provided in each housing 47, i.e. at least one connector 58B is provided in each compartment 45.

In this embodiment of FIG. 23, whatever the variant, the presence of the vacuum station 51 and the connector 56 is optional, wherein the evacuation of the internal volume V47 of each sealed housing 47 is carried out when the sealed housing 47 is contained in its compartment 45. In this housing, the step of transferring the sealed housing 47 into the receiving station 43 is performed before putting the internal volume V47 under vacuum.

In any event, the photovoltaic stack 5 is heated within the receiving station 43, while it is in the sealed housing 47 whose internal volume V47 is put under vacuum, so that the photovoltaic stack 5 is laminated.

As a variant, the receiving station 43 may comprise only one compartment 45, which may optionally accommodate several housings 47.

In one variant, the ventilation of the internal volume V47 of the housings 47 of the stack 5 which has been laminated, is carried out in the internal volume V47 of other housings 47 containing a stack 5 to be laminated. In other words, the vacuum is transferred from one housing 47 to the other in order to save pumping energy and accelerate the evacuation of the housings 47. To do this, the housing 47 to be ventilated is connected, for example, to a housing 47 containing a stack 5 that is not yet laminated.

Figure 24:
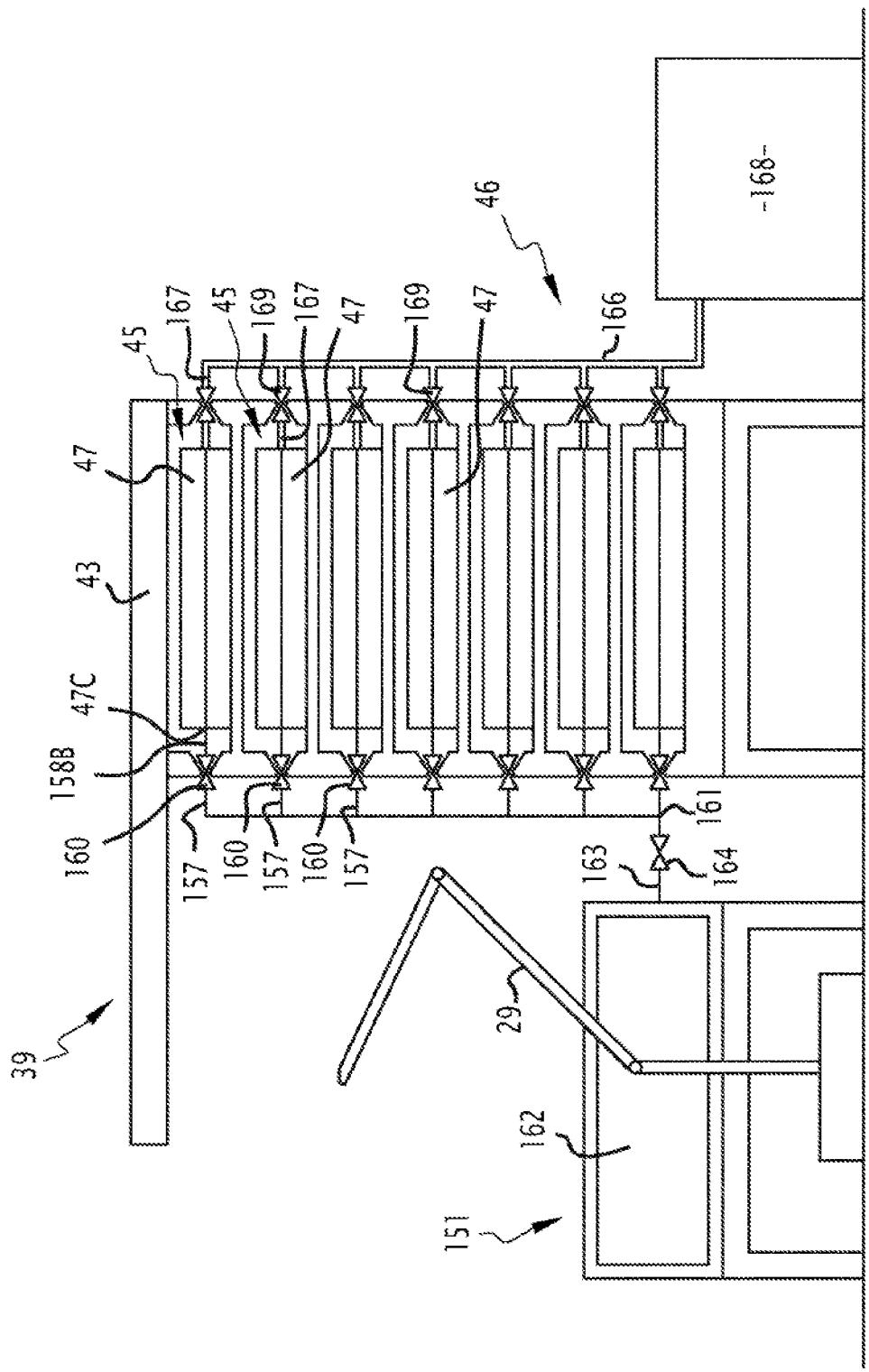
FIG. 24 shows a schematic view of another embodiment of the lamination system of FIGS. 18 to 22.

According to a third embodiment illustrated in FIG. 24, the lamination system 39 comprises a vacuum device 151 comprising a plurality of internal lines 157, each of which opens into one of the compartments 45 of the receiving station 43, so that each sealed housing 47 contained in one of the compartments 45 may be connected to one of the internal lines 157 in order to see its internal volume V47 put under vacuum within the compartment 45. Each internal line 157 is provided with an internal connector 158B located in the compartment 45 in question in order to connect the opening 47C of any housing 47 therein, wherein the opening 47C is provided with a connector that is compatible with the connector 158B. The internal connector 158B may be respectively fluidly connected and disconnected from the casing 47 in question, for example upon the introduction of the housing 47 and the withdrawal of the housing 47 from the compartment 45 in question from the receiving station 43.

The lines 157 are shunted relative to each other. Each line 157 extends between a distribution point 161 of the vacuum device 151, common to all lines 157, and the aforementioned connector 158B.

Each line 157 is provided with a separate and independent valve 160 provided between the distribution point 161 and the connector 158B. Each valve 160 may be controlled separately from the other valves 160, for example using a programmable controller of the vacuum device 151, possibly under the control of a user. Each valve 160 is may be switched between an open state and a closed state, in order to respectively allow or prohibit the transfer of gas or air via the line 157 in question. In this way closing or opening the valve prohibits or allows a pressure transfer between the two connected elements.

The vacuum device 151 of the system 39 of FIG. 24 also includes a vacuum generator 162, which is connected to the distribution point 161 via a main line 163 of the vacuum device 151. The main line 163 is provided with a main valve 164 that is independent of the other valves 160, and is located between the vacuum generator 162 and the distribution point.

With the vacuum device 151, it is possible to produce a vacuum independently in the internal volume of each housing 47 connected to one of the connectors 158B. Which one(s) must be put under vacuum may be selected from the connected housings 47. In particular, it may be provided to close the valve 160 of each line 157 that is not connected to a housing 47. When a housing 47 is connected to one of the lines 157 via its connector 158B, it is possible to open the valve 160 of this line 157, while ensuring that the main valve 164 is open and the generator 162 produces low pressure, i.e. a vacuum, in order to put the housing 47 under vacuum via the line 157 and the main line 163. Once the vacuum is produced in this housing 47, the valve 160 in question may be closed. When a second housing 47 is connected to another line 157, the same operation may be reproduced. Consequently, the introduction and the putting under vacuum of a second housing 47 in the receiving station 43 does not disturb the vacuum of the housings 47 already present in the station 43.

When it is desired to remove a housing 47 from the receiving station 43 while this housing 47 is under vacuum, atmospheric pressure may be restored in its internal volume V47, i.e. ventilation. For this, it is advantageously provided with ventilation means in order to selectively ventilate the internal volume of the housings 47 under vacuum. For example, it is possible to provide, for each line 157, a ventilation valve (not shown) between the valve 160 and the connector 158B, the opening of which communicates the internal volume V47 with the outside.

It is also possible, in order to raise the pressure in the internal volume V47 of the housing 47 under vacuum, to open both the valve 160 associated with this housing 47 and the valve 164, in order to allow communication between the volume V47 of this housing and a vacuum reserve of the generator 162.

It is also possible, to raise the pressure in the internal volume V47 of a first housing 47 under vacuum and connected to a first connector 158B, to allow communication between the interior volume V47 of the first housing 47 and the internal volume V47 of a second housing 47, which is at a higher pressure, such as atmospheric pressure. To do this, the second housing 47 is connected to a second connector 158B. The valves 160 associated with the first connector 158B and the second connector 158B are then opened at the same time, which brings the internal volumes V47 of the first housing 47 and the second housing 47 into communication so that their internal pressure equilibrates. The communication of the two internal volumes is effected via the two lines 157 connected to these housings 47 and via the distribution point 161. It is then possible to ventilate the internal volume V47 of the first housing 47 and to depressurize the internal volume V47 of the second housing 47 under the action of the vacuum generator 162. The work required to be performed by the vacuum generator 162 to put the second housing 47 under vacuum is then less, so that a saving of energy is achieved.

The vacuum device 151 thus makes it possible both to produce a vacuum and to restore the pressure independently of one or more of the housings 47 connected to one of the connectors 158B, as well as to transfer part of the energy required to establish vacuum in a housing 47 to the other, by allowing communication between the internal volume V47 of these housings 47. This energy transfer is reflected in a pressure equalization of the internal volumes V47 of the housings 47 in question. At the end of this transfer operation, the internal volumes V47, initially at a different pressure level, are found to be at substantially the same pressure level.

This lamination system 39 of FIG. 24 may be used in a "first in, first out" operation. To do this, several housings 47 are successively introduced into the receiving station 43 by distributing them in the various compartments 45. For each new housing 47 introduced, this new housing 47 is put under vacuum by activating the generator 162 and opening the valve 164 and the valve 160 associated with this new housing 47, as explained above. The valve 160 is closed once the vacuum has been completed in this new housing 47.

When the last housing 47 is inserted into the last free compartment 45, pressure equalization is performed between the first housing 47, i.e. the one that was first introduced into the receiving station 43, and the last housing 47 introduced into the last free compartment 45. Once the pressure equalization has been performed, it is possible to ventilate and remove the first housing 47 from its compartment 45, and to continue the production of vacuum in the last housing 47 with the aid of the generator 162.

Instead of a single internal line 157 per compartment 45, two internal lines may be provided for each compartment 45, as shown in the embodiment of FIG. 24. For each compartment 45, one of the internal lines may be connected to the cover and the other to the base of the housing 47 introduced into this compartment. In this variant, provision is made for each compartment 45 to have a valve designed to open and close the two internal lines, or a valve for each internal line, depending on the application.

More generally, as illustrated by the embodiment of FIG. 24, the vacuum device comprises means, including in this example the valves 160 and 164, the internal lines 157, the line 163 and the generator 162, in order to selectively put the internal volume V47 of one or more of the sealed housings 47 contained in the receiving station 43 under vacuum, through the internal connectors 158B to which the sealed housings 47, whose internal volume V47 is to be put under vacuum, are connected. The vacuum device also comprises means for allowing communication between the internal volume V47 of several housings 47 connected to the internal connectors 158B, in order to allow equalization of the pressure of these internal volumes V47 with respect to one another.

In this embodiment of FIG. 24, whatever the variant, the presence of the vacuum station 51 and the connection 56 is optional, wherein the putting under vacuum of the internal volume V47 of each sealed housing 47 is performed when the sealed housing 47 is contained in its compartment 45. In this housing, the step of transferring the sealed housing 47 to the receiving station 43 is performed before putting the internal volume V47 under vacuum.

In this embodiment of FIG. 24, the heating means 46 comprise a heat transfer fluid distribution network 166 and a device 168 for heating and circulating this heat transfer fluid. The device 168 comprises, for example, a heat pump and a pump for circulating the heat transfer fluid. The network 166 comprises, for each compartment 45, a line 167 for heating this compartment 45. The lines 167 are shunted relative to each other and are all powered by the device 168. Each line 167 is provided with a valve 169 between the compartment 45 in question and the device 168. Each valve 169 is independent and distinct from the other valves 169, and may be controlled independently, for example using an automaton of the lamination system 39, under the control of a user. Thus, each compartment 45 may be heated independently and selectively, more particularly for selective heating of the photovoltaic stacks 5 contained in the housings 47 placed in all or part of the compartments 45 of the receiving station 43. In particular, it is possible to choose not to supply heat by using the heating means 46 of the embodiment of FIG. 24 only for the housings 47 placed under vacuum and contained in the station 43.

Alternatively, the heating means 46 of this embodiment of FIG. 24 comprise, for each line 167, a connector that is designed to be connected to a reciprocal connector provided for the housing 47 contained in the compartment 45 of the line 167 in question. Each housing 47 thus comprises a heat transfer fluid connector, as well as an internal network of heat transfer fluid opening at this connector. It is thus possible to supply the internal network of each housing 47 introduced into one of the compartments 45 with heat transfer fluid supplied by one of the lines 167. Each housing 47 then forms in itself a device for lamination of a photovoltaic stack 5, by comprising both means for heating and for putting the photovoltaic stack 5 that it contains under vacuum, wherein these means are supplied from the outside of the housing 47, namely, on the one hand by the generator 162, and on the other hand by the device 168.

The machines 33, 35, 37 and 42 as well as the lamination system 39 may be used independently of one another.

The various embodiments and variants described above may be combined to generate new embodiments.

The invention claimed is:

1. A system for laminating photovoltaic stacks, the system comprising:
at least two independent sealed housings, wherein each sealed housing delimits an internal volume that is designed to contain one of the photovoltaic stacks, wherein each sealed housing comprises at least one opening for putting the internal volume of this sealed housing under vacuum;
a receiving station, which comprises at least two independent receiving compartments, wherein each receiving compartment is designed to receive one of the sealed housings, in the internal volume of which is contained one of the photovoltaic stacks;
heating means belonging to the sealed housings or the receiving station, wherein the heating means are designed to independently heat each photovoltaic stack, while these photovoltaic stacks are contained in the internal volume of the sealed housings, and wherein these sealed housings are each contained in one of the receiving compartments;
a device for putting under vacuum the internal volume of the sealed housings through the vacuum opening of each of them; and
a transfer device of each sealed container containing one of the photovoltaic stacks into one of the receiving compartments, in order to heat these photovoltaic stacks using the heating means, while they are contained in the internal volume of the sealed housings under vacuum.

2. The system of claim 1, wherein the transfer device comprises a first robot configured to:
transfer the sealed housing into the receiving compartment; and
passing the sealed housing from an open configuration, in which the photovoltaic stack may be introduced into the sealed chamber, to a closed configuration, in which the internal volume may be put under vacuum.

3. The system of claim 2, wherein the sealed housing comprises a base and a cover that are designed to move between the closed configuration in which they together delimit the internal volume, and the open configuration.

4. The system of claim 1, wherein the internal volume of each sealed housing comprises two chambers separated by a membrane and wherein two vacuum openings are provided, each of which is associated with one of the chambers, wherein one of the two chambers is designed to receive the photovoltaic stack.

5. The system of claim 1, wherein the vacuum device comprises internal connectors which are arranged in the receiving station, wherein each receiving compartment is provided with at least one of the internal connectors, while each internal connector is intended to be connected to the opening for putting one of the sealed housings under vacuum, when this sealed housing is contained in the receiving compartment in question, thereby proceeding to the putting of the internal volume under vacuum, via the internal connector, when the sealed housing is contained in the receiving compartment.

6. The system of claim 5, wherein the vacuum device comprises means for selectively putting under vacuum the internal volume of one or more of the sealed housings connected to the internal connectors.

7. The system of claim 5, wherein the device comprises means allowing communication between the internal volume of several of the sealed housings connected to the internal connectors, to allow pressure equalization of these internal volumes.

8. The system of claim 1, wherein the vacuum device comprises a vacuum station of the internal volume of the sealed housing, wherein the vacuum station is located outside the receiving station, while the sealed housing is designed to substantially maintain the low pressure of the internal volume when separated from the vacuum station.

* * * * *